United States Patent
Zuclich et al.

(10) Patent No.: US 7,017,760 B2
(45) Date of Patent: Mar. 28, 2006

(54) APPARATUS AND METHOD FOR SUPPORT OF ELECTRONIC COMPONENTS

(75) Inventors: Anthony Zuclich, 10029 50th Pl. West, Mukilteo, WA (US) 98275; Judy Zuclich, 10029 50th Pl. West, Mukilteo, WA (US) 98275

(73) Assignees: Anthony Zuclich, Mukilteo, WA (US); Judy Zuclich, Mukilteo, WA (US)

( * ) Notice: Subject to any disclaimer, the term of this patent is extended or adjusted under 35 U.S.C. 154(b) by 184 days.

(21) Appl. No.: 10/695,924

(22) Filed: Oct. 28, 2003

(65) Prior Publication Data

US 2005/0087503 A1 Apr. 28, 2005

(51) Int. Cl.
*A47B 43/00* (2006.01)
(52) U.S. Cl. .................................................. 211/187
(58) Field of Classification Search ............. 211/26, 211/187, 190, 134, 186; 108/106–109
See application file for complete search history.

(56) References Cited

U.S. PATENT DOCUMENTS

| | | | | |
|---|---|---|---|---|
| 3,221,678 A | * | 12/1965 | Doherty | 211/187 |
| 5,347,922 A | * | 9/1994 | Metcalf | 211/187 |
| 5,542,530 A | * | 8/1996 | Freelander | 211/187 |
| 5,794,794 A | * | 8/1998 | Hull | 211/26 |
| 5,833,083 A | * | 11/1998 | Miller | 211/134 |
| 6,202,570 B1 | * | 3/2001 | Kurtsman | 211/187 |
| 6,216,891 B1 | * | 4/2001 | Kreuzer | 211/187 |
| 6,443,319 B1 | * | 9/2002 | Sander | 211/187 |
| 6,516,958 B1 | * | 2/2003 | Tyski | 211/186 |
| 6,595,378 B1 | * | 7/2003 | Wang | 211/186 |
| 6,615,999 B1 | * | 9/2003 | Culp | 211/186 |
| 6,845,871 B1 | * | 1/2005 | Culp | 211/186 |
| RE38,707 E | * | 3/2005 | Merkel | 211/186 |

OTHER PUBLICATIONS

EquaRack® Audio & Home Theater Racks, Model-A, http://www.equarack.com/pages/moda.html, no month & date available.

* cited by examiner

*Primary Examiner*—Hugh B. Thompson, II
(74) *Attorney, Agent, or Firm*—Black Lowe & Graham PLLC

(57) ABSTRACT

Apparatuses and a method are provided for supporting electronic equipment. A base supports a pair of vertical supports. The vertical supports are mounted generally parallel to each other in a first plane and extending in the first plane in a first direction from the base. At least one component support is supported by the vertical supports. The component support includes a pair of support members that generally are mounted parallel to each other in a second plane perpendicular to the first plane and the first direction. The support members are configured to support an underside of an electronic component.

44 Claims, 10 Drawing Sheets

APPARATUS AND METHOD FOR SUPPORT OF ELECTRONIC COMPONENTS

FIELD OF THE INVENTION

This invention relates generally to mounting systems and, more specifically, to mounting systems for electronic equipment.

BACKGROUND OF THE INVENTION

Heat generated by electronic equipment, such as audio equipment, has posed a recurring problem. In the early days of electronics, vacuum tubes generated prodigious quantities of heat. Air circulation had to be considered to provide sufficient cooling to prevent the vacuum tubes from "burning out" prematurely. With the advent of solid state electronics, transistors replaced vacuum tubes. Individual transistors produce less heat than a vacuum tube of comparable function, thereby reducing heat concerns.

However, with technological improvements, heat concerns have reemerged as a problem. In the last few decades, the proliferation of integrated circuits has ushered in an age of digital circuitry in computers and consumer electronics as well audio equipment. A typical stereo amplifier no longer requires vacuum tubes, but now uses microprocessors and a host of other integrated circuits. The dense packing of transistors in these devices has increased the amount of heat a component such as an amplifier generates.

Another technological advance, digital recording, has exacerbated heat concerns relating to audio equipment. To appreciate and the resolution and fidelity possible with compact discs, for example, higher-powered amplifiers are desired. Unfortunately, even with advances in technology, increased power means more heat generated. Non-digital components, such transformers, common in amplifiers and other audio components, not only generate heat but potentially are very sensitive to heat. Heat build-up can cause a transformer or other indispensable component to burn out. Even the best quality, high cost components are at risk in the face of heat build-up.

Notwithstanding the technological improvements advancing audio equipment, little has been done to improve the technology for mounting such equipment. Typically, audio components are mounted on shelves or in entertainment centers. Unfortunately, these conventional mounting systems may put audio components at risk.

FIG. 1 shows a conventional entertainment center 100. The entertainment center 100 supports a plurality of audio components 110, 120, and 130 of different shapes and sizes. The entertainment center 100 supports each of the components 110, 120, and 130 with a number of shelves 140 secured to sidewalls 150. The shelves 140 represent a floor beneath each of the components 110, 120, and 130, as well as a ceiling over each of the components 110, 120, and 130. The shelves 140 secured to sidewalls 140 form individual enclosures 160, 170, and 180 around each the components 110, 120, and 130, respectively. The enclosed spaces 160, 170, and 180 prevent the free circulation of air in and around the contained components, thereby trapping heat. Even in an open-backed shelving system, heat is still enclosed beneath, beside, and above each component. In fact, even in an open-sided shelving system, the presence of the supporting shelves 140 alone causes heat to be trapped between the components 110, 120, and 130 and the shelves 140. The resulting build-up of heat places the expensive components 110, 120, and 130 at risk.

Thus, there is an unmet need in the art for an electronic equipment support system providing for secure support of electronic components and better air circulation around and between the components.

SUMMARY OF THE INVENTION

The present invention includes apparatuses and a method for mounting electronic components to provide for unimpeded air circulation around the electronic components. Because air circulation is not impeded around the electronic components in the way that conventional shelves, entertainment systems, and other enclosures restrict air flow around the electronic components, heat generated by the electronic components can more readily dissipated into the surrounding space. As a result, the electronic components are better protected from heat damage potentially arising from heat buildup occurring around the components.

More particularly, embodiments of the present invention provide apparatuses and a method for supporting electronic equipment. A base supports a pair of vertical supports. The vertical supports are mounted generally parallel to each other in a first plane and extending in the first plane in a first direction from the base. At least one component support is supported by the vertical supports. The component support includes a pair of support members that generally are mounted parallel to each other in a second plane perpendicular to the first plane and the first direction. The support members are configured to support an underside of an electronic component.

In accordance with further aspects of the invention, the base includes a recess configured to receive an inset panel. The inset panel includes an inset material including a material different from that of which the base is composed or is of a different color than the base. The base may be configured to rest on a floor surface with the pair of vertical supports extending upwardly from the floor surface. The base suitably is weighted to lower a center of gravity to protect the apparatus from tipping over. Alternatively, the base may be mounted overhead element with the pair of vertical supports extending downwardly from the overhead element.

In accordance with other aspects of the present invention, the component support includes a lateral member configured to engage each of the vertical supports and further configured to support the pair of support members. The lateral member suitably is fixably coupled to each of the vertical supports. Alternatively, the lateral member is configured to be releasably coupled to each of the vertical supports such that the lateral member can be coupled to the vertical supports at a plurality of points along the vertical supports. The lateral member suitably is secured to the vertical supports with securable fasteners, such as bolts, screws, and pegs, or secured with a gravity-secured mechanism such as a downward facing hook engaging a recess or other element of the vertical support.

In accordance with still further aspects of the present invention, the support members suitably are fixably coupled to the lateral member or are releasably coupled to the lateral member such that the support members can be disposed at varying positions along a length of the lateral member between the vertical supports. In the latter case, the support members are configured to be secured to the lateral member with securable fasteners or, whether resting on top of or coupled below the lateral member, the support members be secured to the lateral member using a gravity-secured mechanism.

Instead of using a lateral member, the support members suitably each are mounted on one of the vertical supports with each support member supporting a platform extending perpendicularly to an opposite vertical support for engaging an end of the underside of the electronic component.

Also, in accordance with additional aspects of the present invention, the vertical supports may include a nonlinear shape such the vertical supports are more or less widely separate at a first end, such as an end closer to the base, than at a second end.

Further, the apparatus suitably includes one or more additional component supports configured to be mounted in planes generally parallel with one another for mounting a plurality of electronic components. One or more lateral braces may be used to couple the vertical support members to each other to provide structural support for the apparatus.

BRIEF DESCRIPTION OF THE DRAWINGS

The preferred and alternative embodiments of the present invention are described in detail below with reference to the following drawings.

DETAILED DESCRIPTION OF THE INVENTION

By way of overview, embodiments of the present invention provide apparatuses and a method for supporting electronic equipment. A base supports a pair of vertical supports. The vertical supports are mounted generally parallel to each other in a first plane and extending in the first plane in a first direction from the base. At least one component support is supported by the vertical supports. The component support includes a pair of support members that generally are mounted parallel to each other in a second plane perpendicular to the first plane and the first direction. The support members are configured to support an underside of an electronic component.

Figure 1:
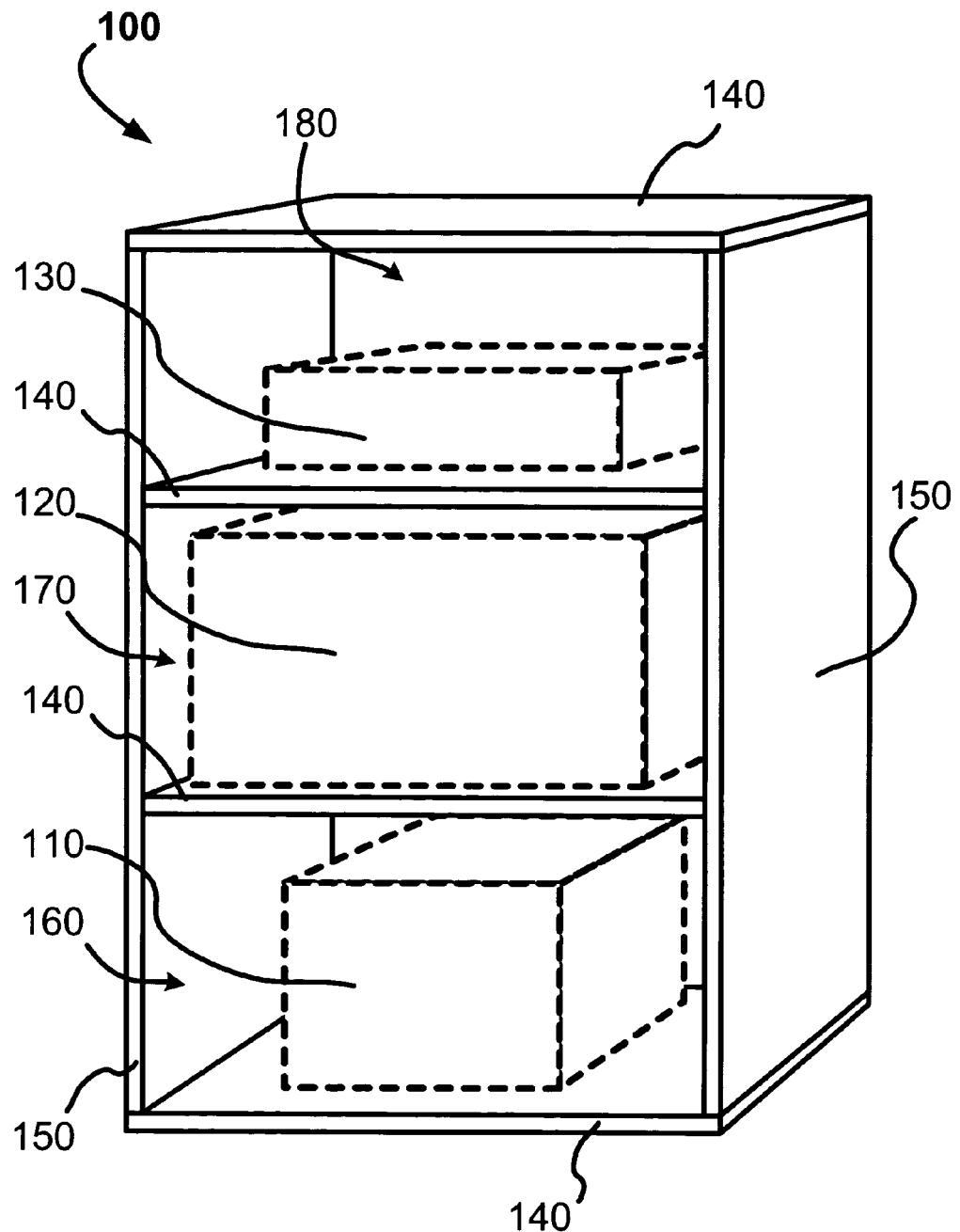
FIG. 1 is a front perspective view of a conventional "entertainment center" for shelving entertainment equipment.
Figure 2:
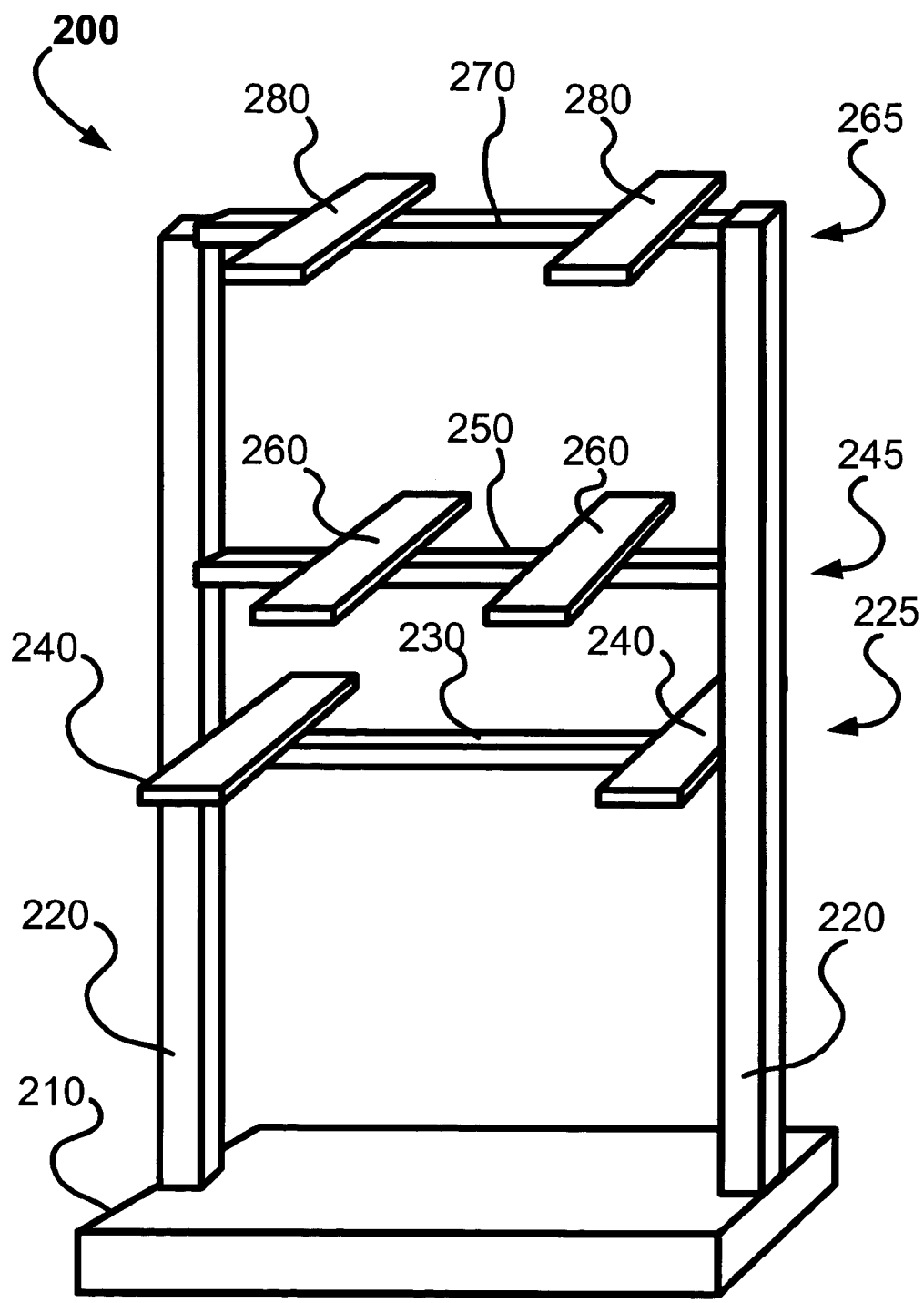
FIG. 2 is a front perspective view of a support system according to an embodiment of the present invention.

FIG. 2 shows a front perspective view of a support system 200 according to an embodiment of the present invention. The system 200 shown is a floor-standing system. The system 200 includes a base 210 to which two vertical supports 220 are mounted. The vertical supports 220 are generally parallel and lie in a plane intersecting planes in which the base 210 and the floor (not shown) lie. The vertical supports 220 support a plurality of component supports 225, 245, and 265. The vertical supports 220 and the component supports 225, 245, and 265 provide a system 200 for mounting electronic components, such as audio equipment, without enclosing sidewalls 140 (FIG. 1) in conventional shelving systems. Without the enclosing sidewalls 140, heat dissipation is improved. The system 200 provides for mounting of the components without underlying shelves 140 (FIG. 1), thereby further improving heat dissipation.

In one presently preferred embodiment, the component supports 225, 245, and 265 each include three structural elements. For example, a first component support 225 includes a single lateral member 230 coupled with the vertical supports 220 at opposing ends of the lateral member 230. Coupled with the lateral member 230 are two support members 240. The support members 240 are mounted on the lateral member 230 such that the support members 240 are generally parallel and lie in a plane perpendicular to the plane in which the vertical supports 220 lie. As will be described below, the lateral member 230 is secured to the vertical supports 220, and the support members 240 are secured to the lateral member 230. From the joining of these elements, upper surfaces of the support members 240 suitably support an electronic component or other device rested up the support members 240.

As also shown in FIG. 2, in one presently preferred embodiment of the invention, the support members 240, 260, and 280 can be situated to allow for the component supports 225, 245, and 265 to accommodate electronic components (not shown) of different sizes. For example, the component support 225 includes support members 240 spaced further apart along the lateral member 250 than are the support members 260 of a second component support 245. A third component support 265 includes support members 280 disposed along the lateral member 270 at a width which is greater than that of the second component support 245 but less wide than that of the first component support 225. Thus, the component supports 225, 245, and 265 can support components of varying widths. As will be described below, the support members 240, 260, and 280 can be fixably coupled or adjustably and releasably mounted on the lateral members 230, 250, and 270, respectively.

Figure 3:
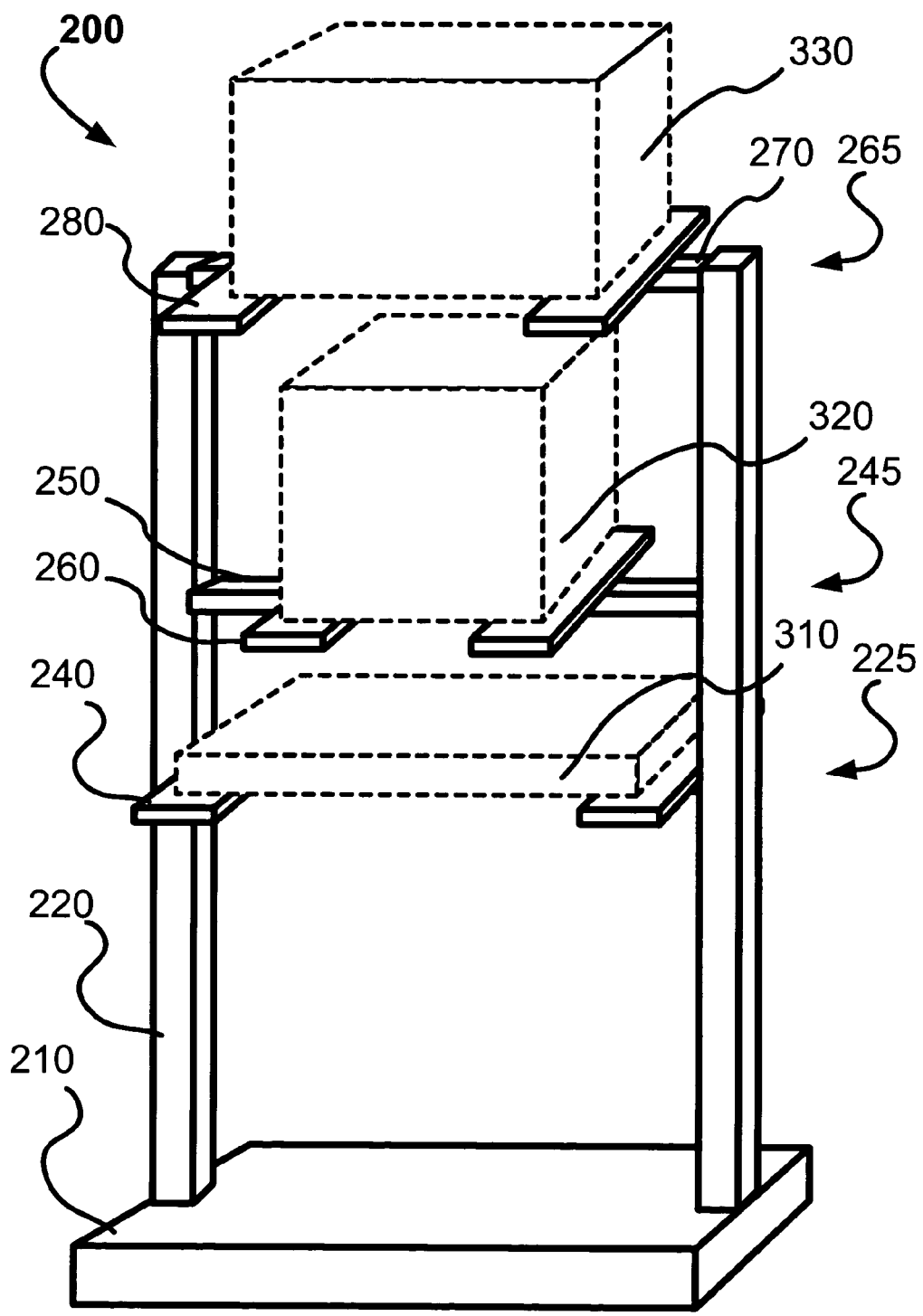
FIG. 3 is a front perspective view of the support system of FIG. 2 supporting a plurality of electronic components.

FIG. 3 shows the system 200 of FIG. 2 supporting a plurality of electronic components 310, 320, and 330. As previously described, deploying the support members 240, 260, and 280 provides flexibility in accommodating the differently-sized components 310, 320, and 330. For a wide component such as electronic component 310, the support members 240 of the first component support 225 are spread sufficiently wide apart. For a narrower component such as electronic component 320, the support members 260 of the second component support 245 are arrayed more closely together. The support members 280 of the third component support 265 are deployed at a spacing between those of the first component support 225 and the second component support 245 to accommodate an electronic component 330 of intermediate width. From FIG. 3, it can be appreciated that the system 200 also provides for the possibility of components with varying thicknesses or heights, as described below.

Figure 4:
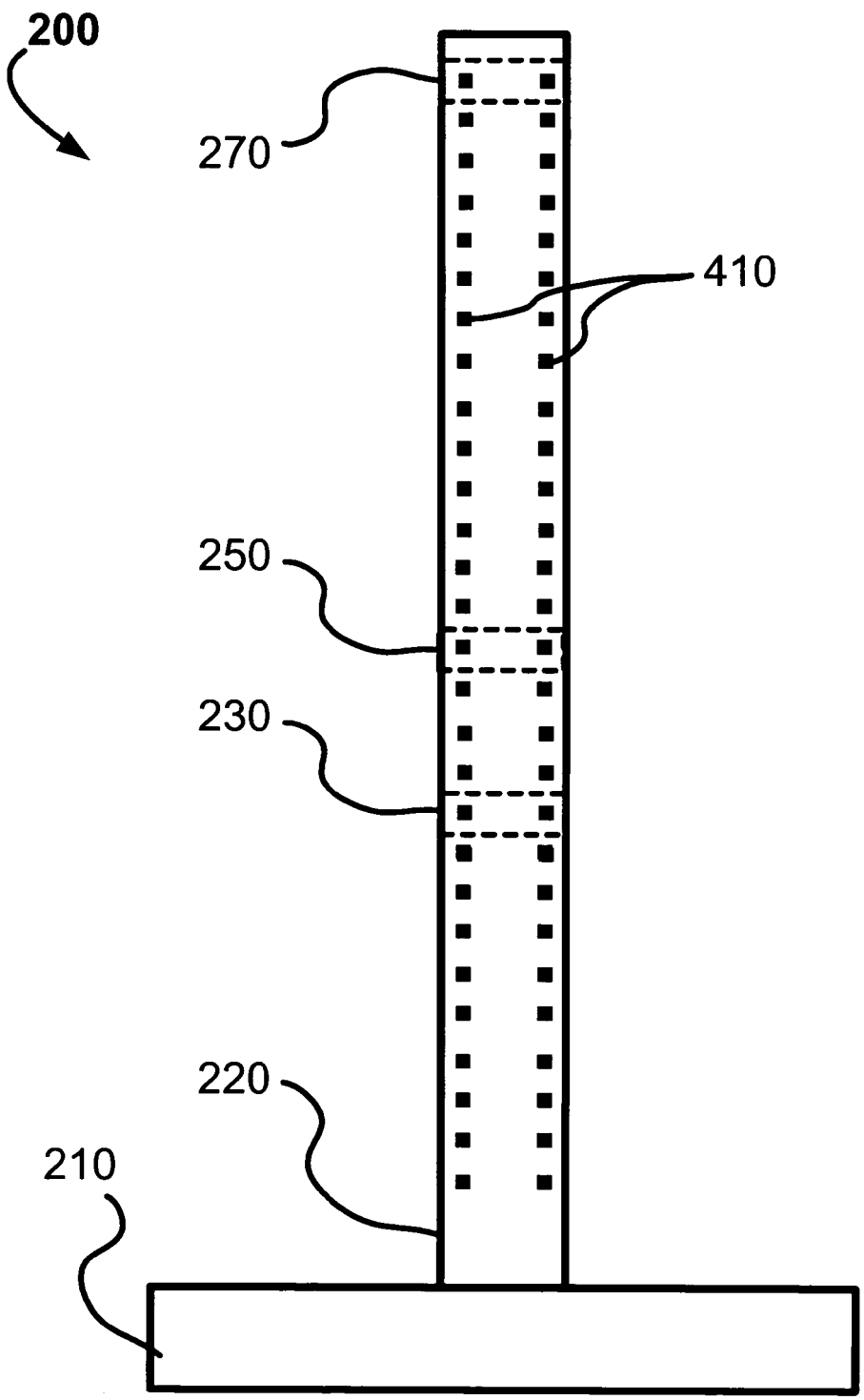
FIG. 4 is a vertical cross-sectional view of a base and a vertical support of the support system of FIG. 2.

FIG. 4 is a vertical cross-sectional view of the base 210 and one of the vertical supports 220 of the system 200. The cross-sectional view shows the base 210 and the vertical support 220 from an inside perspective of the system 200 (FIGS. 2 and 3) with the cross-section taken just inside the vertical support. In one presently preferred embodiment, one or more of the lateral members 230, 250, and 270 are fixably attached to the vertical supports 220. For example, when the vertical supports 220 and the lateral members 230, 250, and 270 are formed from metal, the lateral members 230, 250, and 270, are fixably joined to the vertical supports 220 by welding. Fixed fasteners, such as rivets, fixable fasteners, such as bolts with or without locking washers, and other techniques also suitably are used to fixably attach the lateral members to the vertical supports. Fixably attaching the lateral members 230, 250, and 270 to the vertical supports 220 provides structural reinforcement to support potentially heavy electronic components, and increases structural rigidity of the system 200 as a whole.

Alternatively, as shown in FIG. 4, the system 200 features component supports (not shown) that can be mounted at different heights along the vertical supports 220. In one presently preferred embodiment, the lateral members 230, 250, and 270 are releasably mounted to the vertical supports 220 using a variety of established techniques. For example, the vertical supports 220 may include a plurality of recesses 410 shaped to receive downward-facing hooks (not shown) on ends of the lateral members 230, 250, and 270 allowing the lateral members to be dropped and locked into place. Alternatively, the lateral members 230, 250, and 270 may be releasably secured to the vertical supports 220 with screws, bolts, pegs, or similar mounting devices (not shown) received by openings 410 in the vertical supports that engage the lateral members 230, 250, and 270 through an end piece or an integrated or separate bracket (not shown). With releasably attachable lateral members 230, 250, and 270, components of varying thicknesses or heights can be accommodated. It will also be appreciated that one or more of the lateral members 230, 250, and 270 could be fixably attached with fasteners, welds, or other techniques to provide structural bracing for the system. A combination of fixably and releasably attached lateral members 230, 250, and 270 suitably provides for sturdiness and component mounting flexibility in using the system 200.

Figure 5:
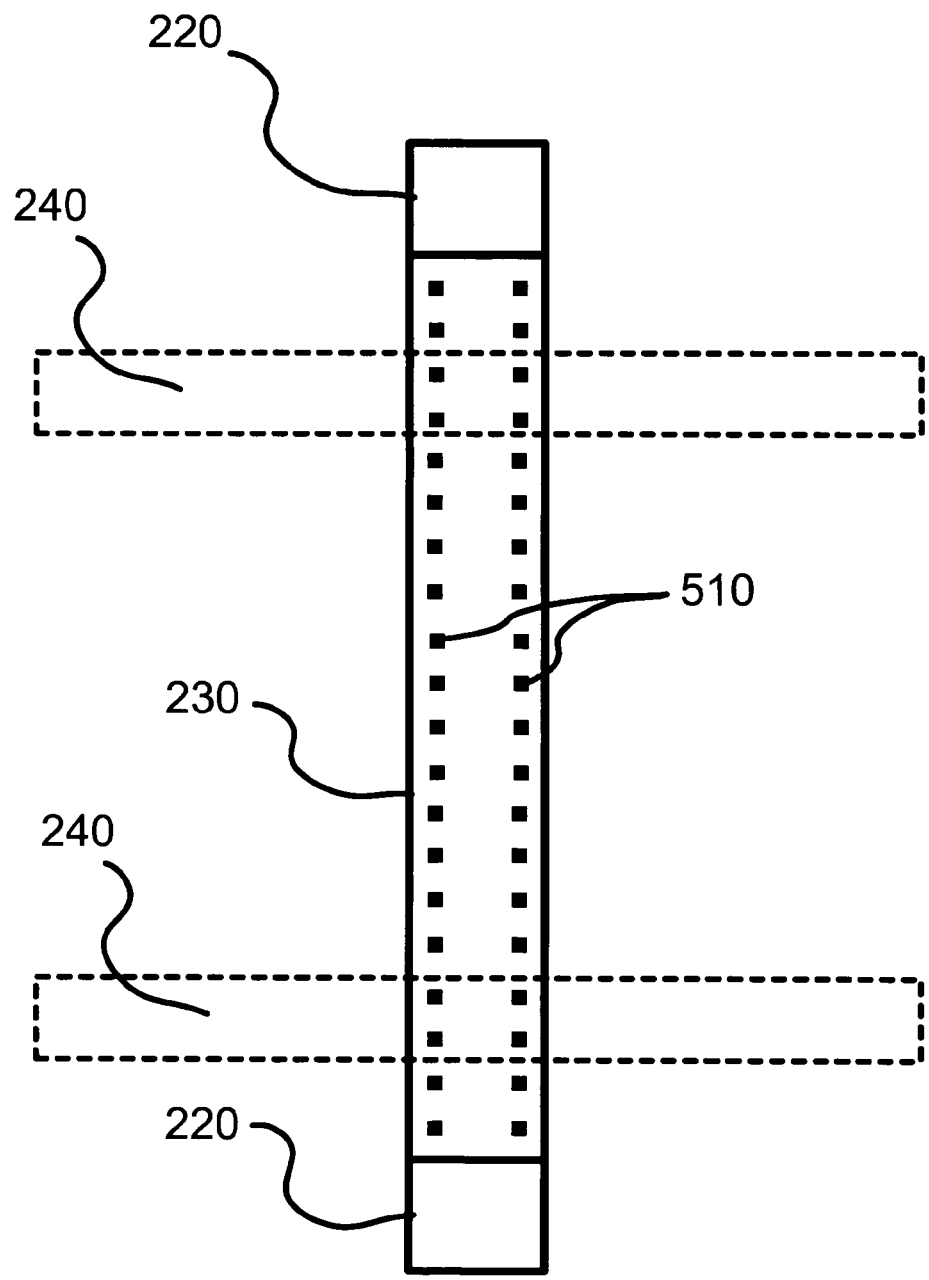
FIG. 5 is a top-down view of vertical supports, a lateral member, and support members of the support system of FIG. 2.

FIG. 5 is a top-down view of vertical supports 220, a lateral member 230, and support members 240 of the system 200. In one presently preferred embodiment, the support members 240 are fixably attached to the lateral member 230 to provide structural support and rigidity to support potentially heavy electronic components disposed on the support members 240. Alternatively, the support members 240 suitably are releasably mounted to the lateral member 230. The support members 240 can be secured to the lateral member 230 using fasteners such as screws, bolts, pegs, or another device received by openings 510 formed in the lateral member 230. Alternatively, the support members 240 suitably are fitted with integrated pegs on an underside of the support members that are received by the openings 510 in the lateral member. Further alternatively, the support members 240 are mounted below the lateral member 230 and engage the lateral member 230 with upwardly extending connectors securing the support members 240 to the lateral member 230 (not shown). Allowing the support members 240 to be releasably and adjustably mounted to the lateral member 230 provides for great flexibility in accommodating components of varying widths. It also is appreciated that the support members 240 suitably are fixably attached to the lateral member 230 for strength. Further, from FIG. 5, it can be appreciated that the component (not shown) rested on the support members 240 will have access to open air circulation beneath the component because there is no shelf to trap heat directly beneath the component.

Figure 6:
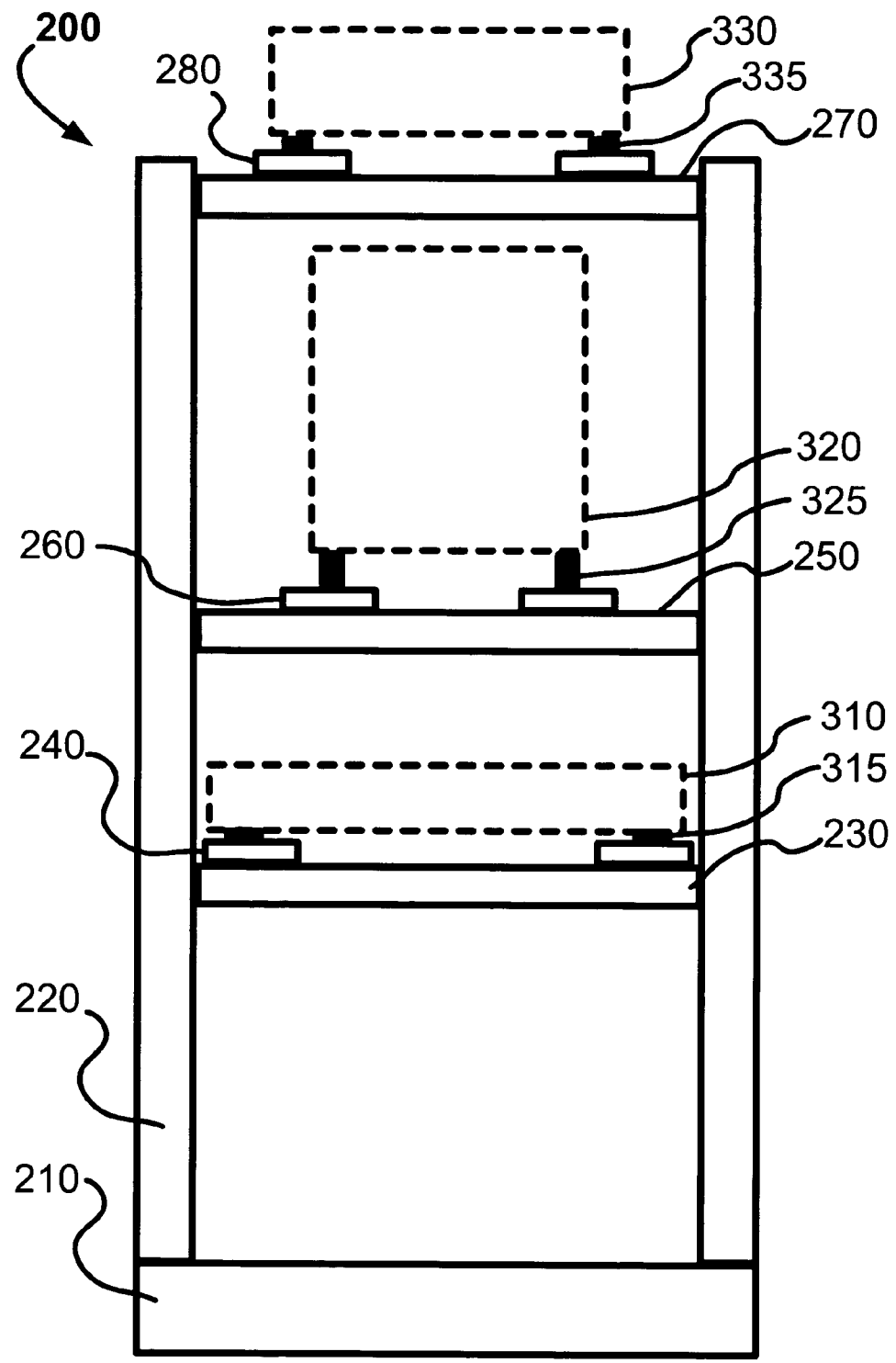
FIG. 6 is a front view of the support system of FIG. 2 supporting a plurality of electronic components.

FIG. 6 is a front view of the system 200 supporting a range of components 310, 320, and 330. FIG. 6 highlights how positioning of the support members 240, 260, and 280 accommodates components 310, 320, and 330 of varying heights and widths. As do most non-rack-mounted electronic components, the components 310, 320, and 330 have mounting feet 315, 325, and 335, respectively. Thus, for example, the support members 240 can be spaced along the lateral member 230 to engage the feet 315 of the first component 310. Similarly, the support members 260 can be disposed to engage the feet 325 of the component 320 and the support members 280 can be disposed to engage the feet 335 of the component 330. Thus, even without a heat-trapping shelf to support the components 310, 320, and 330, the system 200 can be disposed to accommodate the design of the components 310, 320, and 330. Similarly, the lateral members 230, 250, and 270 can be mounted on the vertical supports 220 to accommodate components 310, 320, and 330 having different heights. As described in connection with FIG. 4, one presently preferred embodiment of the system 200 provides flexibility for the number and size of the components which one desires to mount in the system 200.

Figure 7:
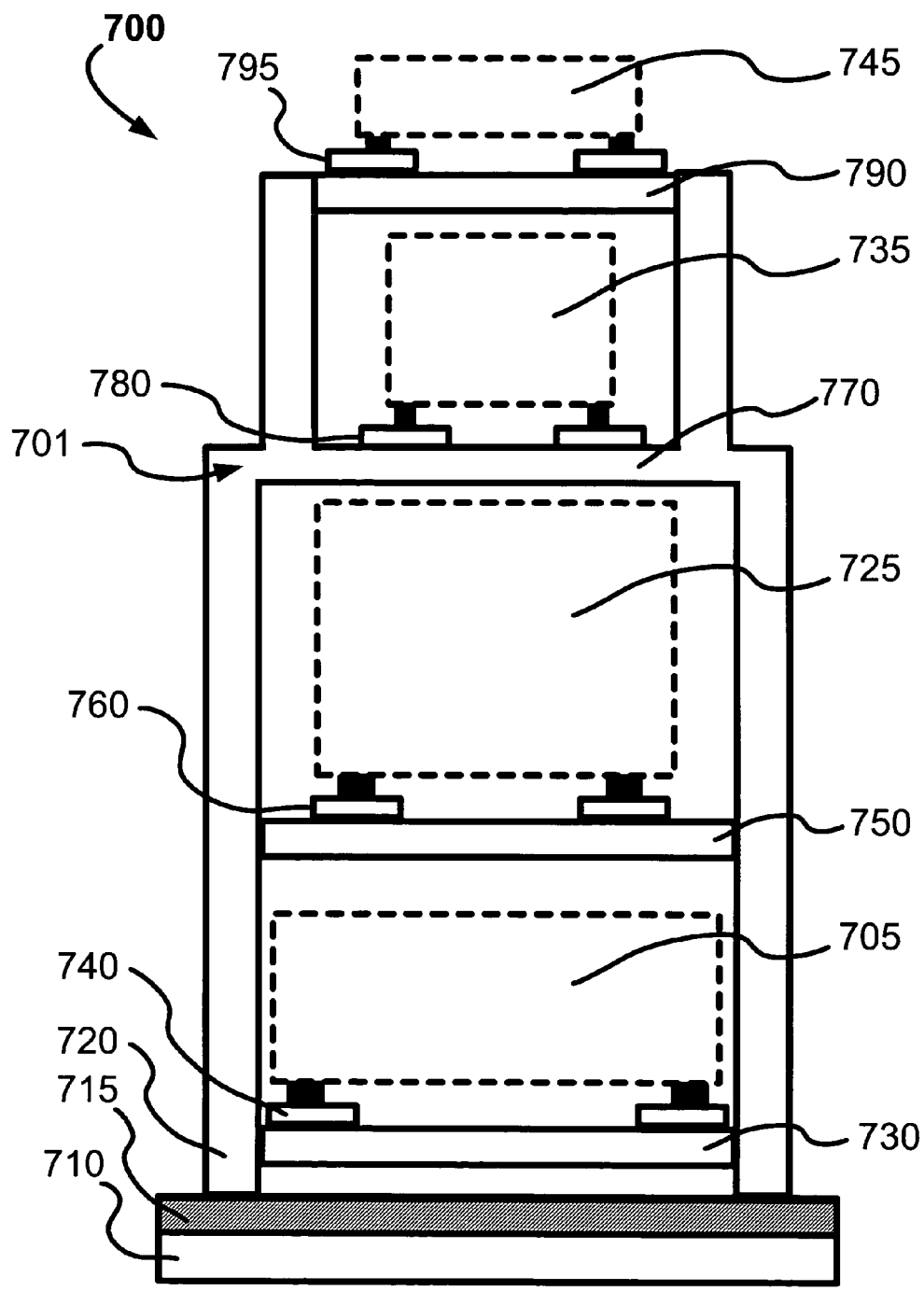
FIG. 7 is a front view of a support system supporting a plurality of electronic components according to another embodiment of the present invention.

FIG. 7 is a front view of another embodiment of the present invention. The system 700 is similar to the system 200 (FIGS. 2–6) except for four variations. First, the system 700 includes vertical supports 720 which are not merely straight, linear elements. At a lateral member 770, the linear supports bend inwardly toward each other. As a result, a width between the vertical supports is wider below the lateral member 770 than above the lateral member 770, allowing for the possibility of mounting wider components below the lateral member 770 than above it. The configuration of the system 700 could be reversed to allow for the width to be greater above the lateral member 770 than below it if desired. It will be appreciated that the vertical supports 720 could be shaped to create a plurality of wider and narrower widths the vertical supports 720 along a vertical dimension of the system 720. It also will be appreciated that each of the vertical supports 720 suitably are formed from a single section of material, such as a piece of metal forged or otherwise shaped to create varying widths between the vertical supports along the vertical dimension of the system 700. Alternatively, the vertical supports 720 can be formed from a number of sections joined together to present a vertical support 720 having a linear shape or a shape directed to allow varying widths between the vertical supports along the vertical dimension of the system 700. Each of the vertical supports 720 also can be formed from a number of sections or each of the vertical supports suitably is comprised of a single section shaped to provide a nonlinear appearance in a dimension perpendicular to the width and height of the system 700.

Second, the system 700 features a fixably coupled lateral member 770 mounted between the vertical supports 720. The fixably coupled lateral member 770 provides for potentially greater structural rigidity to support the integrity of the system 700.

Third, the system 700 shows that the number of components 705, 725, 735, and 745 can be varied according to needs and desires. Whereas previous figures only show three components, four components 705, 725, 735, and 745 are supported by the system 700. The first component 705 is mounted on support members 740 coupled with a lateral member 730. It will be appreciated that, mounting the component 705 on the support members 740, even toward the bottom of the system 700, provides for greater air circulation under and around the component 705 than if the component 705 had been, for example, rested directly on the base 710 of the system. Support members 760 coupled with the lateral member 750 support a second component 725. Support members 780 coupled with the fixably attached member and brace 770 support a third component 735. Thus, a fixably attached lateral member 770 can serve both as a brace for structural integrity of the system 700 and as a lateral member to which support members 780 are attachable. Finally, a lateral member 790 that is shorter in length than other releasably attached lateral members 730 and 750 can be coupled with support members 795 to support the component 745. Thus, a combination of wider, fixed, and narrower lateral elements can be used to support a variety of components.

Fourth, the base 710 includes a recess (not shown) receiving an inset 715. The inset 715 suitably includes a material of a different composition or a different color than the base 710. The inset 715 thus allows for the system 700 to make the base 710 more conspicuous than the base 710 material alone to prevent persons from tripping over the base 710, to make the base 710 more aesthetically pleasing, or to help the system 700 better match other furniture.

It will be appreciated that the base 210 (FIGS. 2–6) or 710 (FIG. 7) suitably is weighted to enhance stability of the systems 200 and 700. Adding weight to the base lowers a center of gravity of the system 200 or 700. It is desirable to include or add sufficient weight to the base 210 or 710 such that a moment arm of between the center of gravity and the supporting surface is shorter than the moment arm between a front edge of the base and the perpendicular projection from the center of gravity to the supporting surface or between a rear edge of the base and the perpendicular projection of the center of gravity. Such weighting makes the system 200 or 700 less likely to be inadvertently tipped over.

Figure 8:
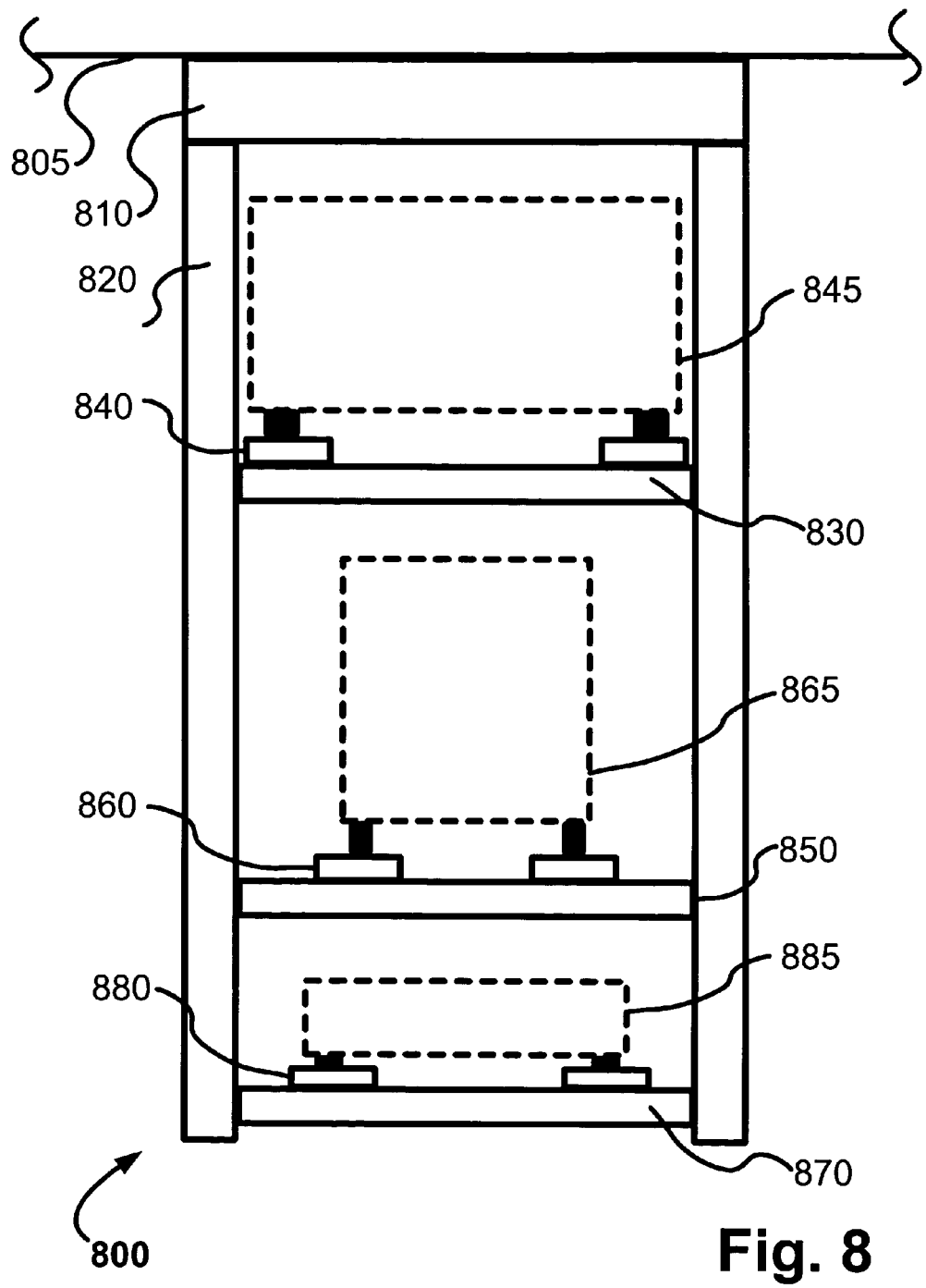
FIG. 8 is a front view of the support system supporting a plurality of electronic components according to another embodiment of the present invention.

FIG. 8 shows a system 800 according to an embodiment of the present invention. The system 800 is configured to be mounted to an overhead element 805, such as a ceiling or a beam. The base 810 is mounted to the overhead element 805. The vertical supports 820 are mounted to the base 810. Lateral members 830, 850, and 870 are coupled with the vertical supports 820 and, in turn, are coupled with support members 840, 860, and 880, respectively. The system 800 thus allows components 845, 865, and 885, of varying heights and widths to be mounted from an overhead element 805 rather than from a floor surface.

Figure 9:
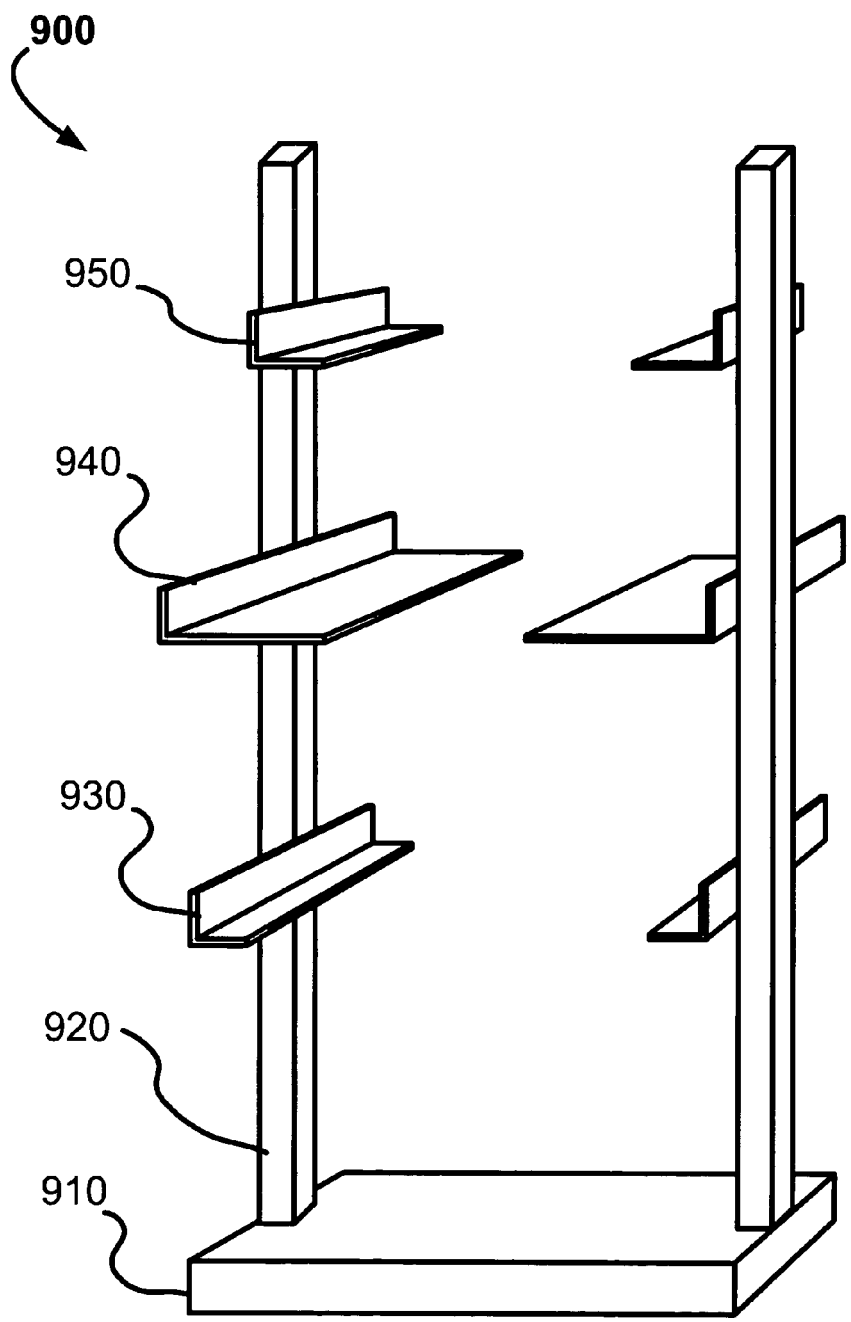
FIG. 9 is a front perspective view of a support system according to another embodiment of the present invention.

FIG. 9 shows a system 900 according to another embodiment of the present invention. The system 900 features a floor-mounted base 910 coupled with vertical supports 920 supporting pairs of support brackets 930, 940, and 950. It will be appreciated that the support brackets 930, 940, and 950 engage the vertical supports 920 and provide perpendicularly, inwardly extending planar supports to support components (not shown). The support brackets 930, 940, and 950 have different widths allowing for mounting of components of varying widths. The support brackets 930, 940, and 950 can be mounted at various points along the vertical supports to accommodate components of varying heights as well. Thus, the system 900 provides for shelfless support of components (not shown) without lateral members to couple the support brackets 930, 940, and 950 to the vertical supports.

Figure 10:
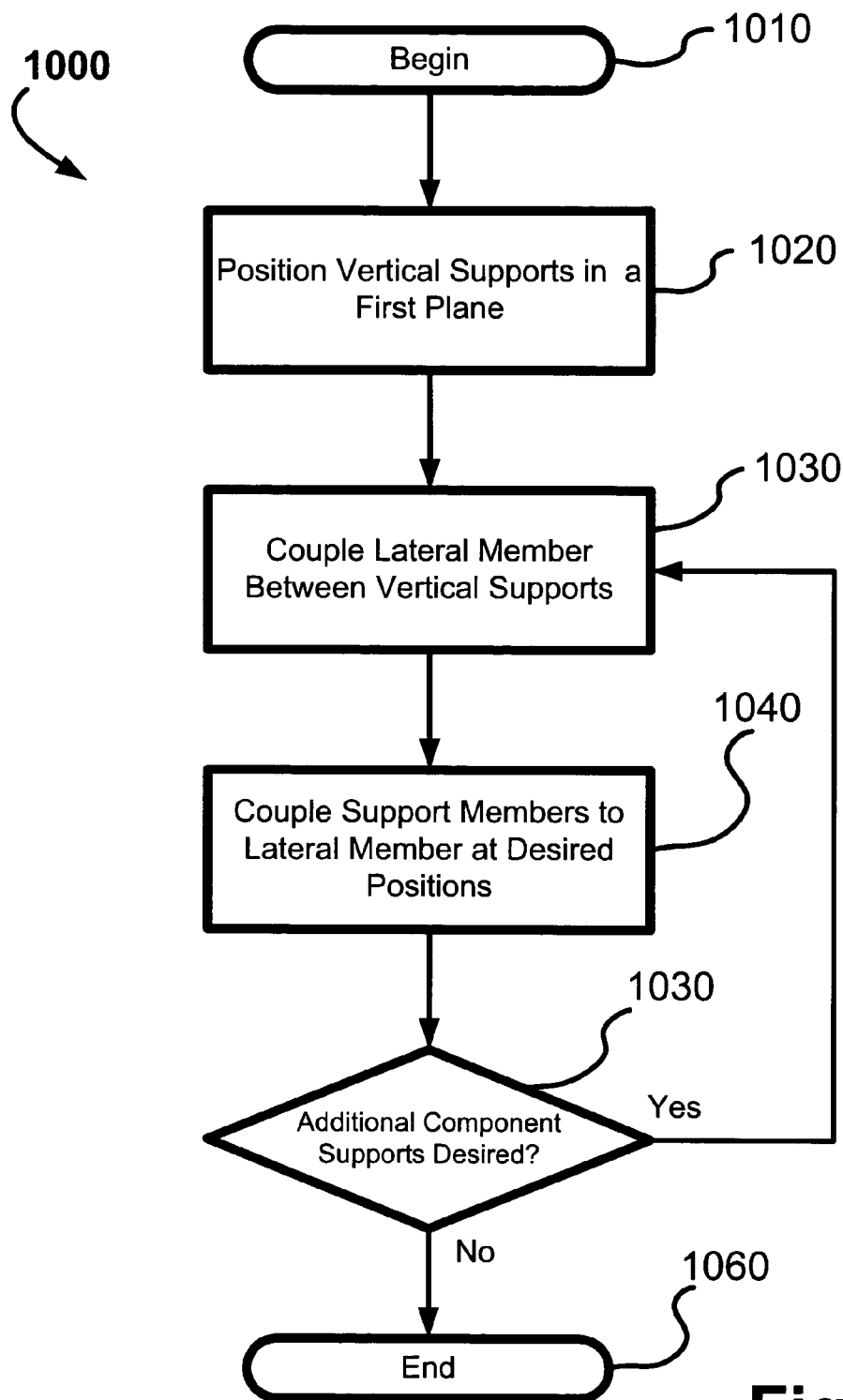
FIG. 10 is a flowchart of a routine for supporting components according to an embodiment of the present invention.

FIG. 10 is a routine 1000 for supporting electronic components according to an embodiment of the present invention. The routine 1000 begins at a block 1010. At a block 1020, vertical supports are positioned. The vertical supports are disposed generally parallel to each other in a first plane. At a block 1030, a lateral member is coupled to the vertical supports. At a block 1040, support members are coupled to the lateral member at desired positions to receive and support a component. At a block 1050, it is determined if other component supports are desired. If so, the routine 1000 loops to the block 1030. If not, the routine ends at a block 1060. It will be appreciated that, if component supports without separate lateral members and support members (FIG. 9) are used, processes at the blocks 1030 and 104 suitably are combined.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

What is claimed is:

1. An apparatus for supporting at least one electronic equipment component, the apparatus comprising:
   a base;
   a pair of vertical supports configured to be secured to the base, the vertical supports being further configured to be mounted generally parallel to each other in a first plane and extending in the first plane in a first direction from the base; and
   at least one component support, the component support including a pair of support members configured to be supported by the vertical supports, the pair of support members being configured to be mounted generally parallel to each other in a second plane perpendicular to the first plane and the first direction and further configured to support an underside of an electronic component, wherein the base includes a recess configured to receive at least one inset panel, the inset panel including an inset material that is one of differently constituted and differently colored than a base material of which the base is comprised.

2. The apparatus of claim 1, further comprising at least one additional component support, the additional component support including a pair of additional support members being configured to be mounted generally parallel to each other in a third plane perpendicular to the first plane and parallel to the second plane.

3. The apparatus of claim 1, wherein the base is configured to rest on a floor surface and the pair of vertical supports is configured to extend upwardly from the floor surface in the first direction.

4. The apparatus of claim 3, wherein the base is configured to include securing mass configured to lower a center of gravity of the apparatus such that a first distance from the center of gravity to the floor surface is shorter than a second distance from a front edge and a rear edge of the base measured along the floor surface to a projection of the center of gravity along the floor surface.

5. The apparatus of claim 1, wherein the base is configured to be mounted on an overhead element and the pair of vertical supports is configured to extend downwardly from the overhead element in the first direction.

6. The apparatus of claim 1, wherein the component support includes a lateral member configured to engage each of the vertical supports and further configured to support the pair of support members.

7. The apparatus of claim 6, wherein the lateral member is fixably coupled to each of the vertical supports.

8. The apparatus of claim 6, wherein the lateral member is configured to be releasably coupled to each of the vertical supports such that the lateral member can be coupled to the vertical supports at a plurality of points along the first direction.

9. The apparatus of claim 8, wherein the lateral member is configured to be secured to the vertical supports with securable fasteners.

10. The apparatus of claim 9, wherein the securable fasteners include at least one of bolts, screws, and pegs.

11. The apparatus of claim 8, wherein each end of the lateral member includes at least one downward-facing hook configured to engage the vertical support.

12. The apparatus of claim 11, wherein the downward-facing hook is received in a recess on the vertical support.

13. The apparatus of claim 6, wherein the support members are fixably coupled to the lateral member.

14. The apparatus of claim 6, wherein the support members are configured to be releasably coupled to the lateral member such that the support members can be disposed at varying positions along a length of the lateral member.

15. The apparatus of claim 14, wherein the support members are configured to be secured to the lateral member with securable fasteners.

16. The apparatus of claim 15, wherein the securable fasteners include at least one of bolts, screws, and pegs.

17. The apparatus of claim 6, wherein the pair of support members rest on an upper surface of the lateral member.

18. The apparatus of claim 1, wherein each of the pair of support members is configured to be supportably mounted on a first vertical support, each of the support members including a platform extending perpendicularly toward a second vertical support.

19. The apparatus of claim 1, wherein each of the vertical supports includes a plurality of vertical support sections.

20. An apparatus for supporting at least one electronic equipment component, the apparatus comprising:
a base;
a pair of vertical supports configured to be secured to the base, the vertical supports being further configured to be mounted generally parallel to each other in a first plane and extending in the first plane in a first direction from the base; and
at least one component support, the component support including a pair of support members configured to be supported by the vertical supports, the pair of support members being configured to be mounted generally parallel to each other in a second plane perpendicular to the first plane and the first direction and further configured to support an underside of an electronic component, wherein the support members are configured to be secured to the lateral member with a gravity-secured mechanism.

21. The apparatus of claim 20, wherein an underside of the support members include at least one downward-facing peg configured to be received by a socket in an upper face of the lateral member.

22. The apparatus of claim 20, wherein the support member includes an upwardly extending suspension member received by a receiving orifice on the lateral member.

23. An apparatus for supporting at least one electronic equipment component, the apparatus comprising:
a base;
a pair of vertical supports configured to be secured to the base, the vertical supports being further configured to be mounted generally parallel to each other in a first plane and extending in the first plane in a first direction from the base; and
at least one component support, the component support including a pair of support members configured to be supported by the vertical supports, the pair of support members being configured to be mounted generally parallel to each other in a second plane perpendicular to the first plane and the first direction and further configured to support an underside of an electronic component, wherein each of the vertical supports includes a nonlinear shape.

24. The apparatus of claim 23 wherein each of the vertical supports includes the nonlinear shape wherein a first width between the vertical supports at a first end of the vertical supports adjoining the base is not equal to a second width between the vertical supports at a second end not adjoining the base.

25. The apparatus of claim 24, wherein first width is greater than the second width.

26. The apparatus of claim 23, wherein each of the vertical supports includes the nonlinear shape in a third plane perpendicular to the first plane and the second plane.

27. An apparatus for supporting at least one electronic equipment component, the apparatus comprising:
a base;
a pair of vertical supports configured to be secured to the base, the vertical supports being further configured to be mounted generally parallel to each other in a first plane and extending in the first plane in a first direction from the base;
at least one component support, the component support including a pair of support members configured to be supported by the vertical supports, the pair of support members being configured to be mounted generally parallel to each other in a second plane perpendicular to the first plane and the first direction and further configured to support an underside of an electronic component; and
at least one lateral brace configured to securably couple the vertical support members to each other at a distance removed from the base along the first direction.

28. A method for supporting at least one electronic equipment component, the method comprising:
providing a pair of vertical supports generally parallel to each other in a first plane;
coupling to each of the vertical supports a pair of support members, the pair of support members being configured to be mounted generally parallel to each other in a second plane perpendicular to the first plane between the vertical supports; and
positioning the pair of support members to support an underside of an electronic component without covering an entirety of the underside of the electronic component, wherein the vertical supports extend downwardly from an overhead element.

29. The method of claim 28, further comprising providing a base configured to securably receiving a first end of each of the vertical supports.

30. The method of claim 28, wherein the vertical supports extend upwardly from a floor surface.

31. The method of claim 28, further comprising coupling to each of the vertical supports a plurality of pairs of support members for supporting a plurality of electronic components.

32. The method of claim 28, further comprising joining the vertical supports with at least one lateral brace configured to securably couple the vertical support members to each other.

33. The method of claim 28, further comprising forming the vertical supports from a plurality of vertical support sections.

34. A method for supporting at least one electronic equipment component, the method comprising:
  providing a pair of vertical supports generally parallel to each other in a first plane;
  coupling to each of the vertical supports a pair of support members, the pair of support members being configured to be mounted generally parallel to each other in a second plane perpendicular to the first plane between the vertical supports;
  positioning the pair of support members to support an underside of an electronic component without covering an entirety of the underside of the electronic component, wherein coupling the pair of support members to each of the vertical supports includes coupling an lateral member to each of the vertical supports and coupling the pair of support members to the lateral member; and
  securing the support members to the lateral member with a gravity-secured mechanism.

35. The method of claim 34, further comprising fixably coupling the lateral members to each of the vertical supports.

36. The method of claim 34, further comprising releasably coupling the lateral member to each of the vertical supports such that the lateral member can be coupled to the vertical supports at a plurality of points along vertical supports.

37. The method of claim 36, further comprising releasably coupling the lateral member to the vertical supports with securable fasteners.

38. The method of claim 34, further comprising fixably coupling the support members to the lateral member.

39. The method of claim 34, further comprising resting the support members rest on an upper surface of the lateral member.

40. A method for supporting at least one electronic equipment component, the method comprising:
  providing a pair of vertical supports generally parallel to each other in a first plane;
  coupling to each of the vertical supports a pair of support members, the pair of support members being configured to be mounted generally parallel to each other in a second plane perpendicular to the first plane between the vertical supports;
  positioning the pair of support members to support an underside of an electronic component without covering an entirety of the underside of the electronic component; and
  forming the vertical supports to include a nonlinear shape.

41. The method of claim 40, wherein each of the vertical supports includes the nonlinear shape wherein a first width between the vertical supports at a first end of the vertical supports adjoining the base is not equal to a second width between the vertical supports at a second end not adjoining the base.

42. The method of claim 41, wherein first width is greater than the second width.

43. The method of claim 40, wherein each of the vertical supports includes the nonlinear shape in a third plane perpendicular to the first plane and the second plane.

44. A method for supporting at least one electronic equipment component, the method comprising:
  providing a pair of vertical supports generally parallel to each other in a first plane;
  coupling to each of the vertical supports a pair of support members, the pair of support members being configured to be mounted generally parallel to each other in a second plane perpendicular to the first plane between the vertical supports;
  positioning the pair of support members to support an underside of an electronic component without covering an entirety of the underside of the electronic component, wherein coupling the pair of support members to each of the vertical supports includes coupling an lateral member to each of the vertical supports and coupling the pair of support members to the lateral member; and
  releasably coupling the support members to the lateral member such that the support members can be disposed at varying positions along a length of the lateral member, wherein releasably coupling is performed with securable fasteners.

* * * * *